United States Patent
Steensgaard-Madsen

(10) Patent No.: US 6,473,011 B1
(45) Date of Patent: Oct. 29, 2002

(54) SERIAL D/A CONVERTER COMPENSATING FOR CAPACITOR MISMATCH ERRORS

(76) Inventor: Jesper Steensgaard-Madsen, 448 Riverside Dr., Apt. #2, New York, NY (US) 10027

( * ) Notice: Subject to any disclaimer, the term of this patent is extended or adjusted under 35 U.S.C. 154(b) by 0 days.

(21) Appl. No.: 09/609,848

(22) Filed: Jul. 5, 2000

Related U.S. Application Data
(60) Provisional application No. 60/149,829, filed on Aug. 19, 1999.

(30) Foreign Application Priority Data
Dec. 14, 1999 (WO) .............................. PCT/DK99/00700

(51) Int. Cl.[7] .............................. H03M 1/06; H03M 1/66
(52) U.S. Cl. ...................................... 341/118; 341/150
(58) Field of Search ................................. 341/118, 120, 341/122, 136, 143, 144, 139, 150, 156, 172; 327/337; 375/240.29; 330/149

(56) References Cited

U.S. PATENT DOCUMENTS

| | | | |
|---|---|---|---|
| 3,906,488 A | | 9/1975 | Suarez-Gartner |
| 4,399,426 A | * | 8/1983 | Tan .............................. 341/120 |
| 4,782,324 A | * | 11/1988 | Underwood ................. 341/147 |
| 5,369,403 A | | 11/1994 | Temes et al. |
| 5,389,928 A | | 2/1995 | Coppero et al. |
| 5,406,283 A | | 4/1995 | Leung |
| 5,724,038 A | | 3/1998 | Koifman et al. |
| 6,194,946 B1 | * | 2/2001 | Fowers ........................ 327/337 |

FOREIGN PATENT DOCUMENTS
WO    WO 98/48515    10/1998

OTHER PUBLICATIONS
Search report established Jun. 9, 2000, for appl. PCT/DK99/00700, on which this application is based (3 pages). The statement regarding lack of novelty with regard to WO1 and US1 is contended.

(List continued on next page.)

*Primary Examiner*—Patrick Wamsley

(57) ABSTRACT

A digital-to-analog converter system [150] based on a symmetrical circuit [152] comprising matched capacitors [104][106] for pseudo-passive, serial D/A conversion of a digital input signal x(n). Each bit x(n, k) of x(n) is converted by selecting one of the two capacitors in each capacitor pair [104][106] as the driving one, and charging it to plus/minus the reference voltage according to the value of x(n, k). The other capacitor in each capacitor pair [104][106] stores the previously generated voltage signal representing the bits of x(n) less significant than the bit x(n, k) being processed in the considered cycle k of the serial conversion process. After the driving capacitor has been charged according to x(n, k), the capacitors in each capacitor pair [104][106] are connected in parallel. Voltage signals representing the bits of x(n) having significance of up to and including x(n, k) is thereby generated on the capacitors [104][106]. Because the circuit [152] is symmetrical, a selector signal t(n, k) may designate arbitrarily which capacitor in each capacitor pair [104][106] be the driving one, and which be the storing one. The selector signal t(n, k) may attain a new value for the processing of each bit x(n, k). The selector signal t(n, k) is generated such that the error signal induced by mismatch of the matched capacitor pairs [104][106] will be noise-like and have a reduced power spectral density in the selected signal band. The selector signal t(n, k) is particularly simple to generate if each sample of the input signal x(n) is repeated twice, which it will be when using a popular type of interpolation filters. When each serial conversion cycle is completed, the generated voltage will represent x(n); only then, the capacitor pairs [104][106] are connected to the driving opamps [118A][118B].

32 Claims, 11 Drawing Sheets

OTHER PUBLICATIONS

Figure 4:
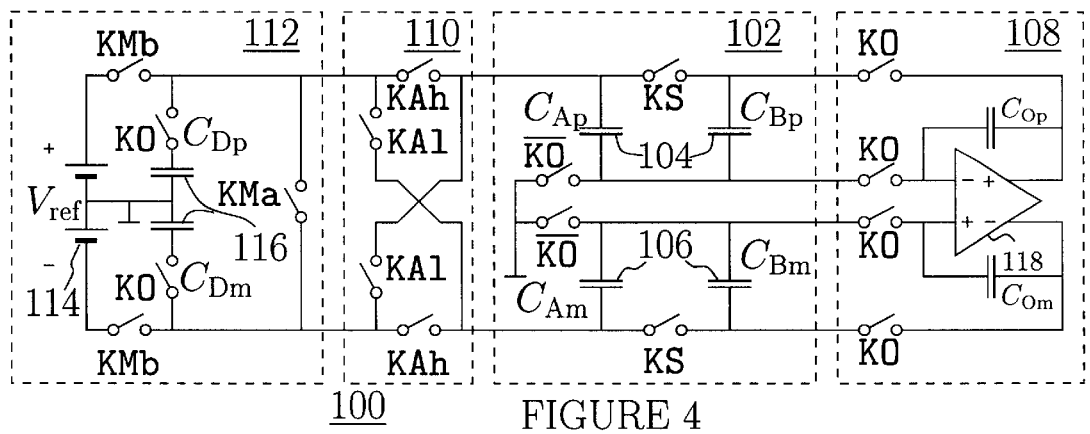

Jesper Steensgaard et al., "Mismatch–shaped Pseudo–Passive Two–Capacitor DAC" IEEE Alessandro Volta Memorial Workshop on Low–Power Design, Como Italy, Mar. 1999.

P. Rombouts et al. "Capacitor Mismatch Compensation for the Quasi–Passive Switched–Capacitor DAC" IEEE Transactions on Circuits and Systems—I, Fundamental Theory and Applications, Jan. 1998.

Jesper Steensgaard et al., "Mismatch–Shaping Serial Digital–to–Analog Converter" IEEE International Symposium on Circuits and Systems, Florida, Jun. 1999.

* cited by examiner

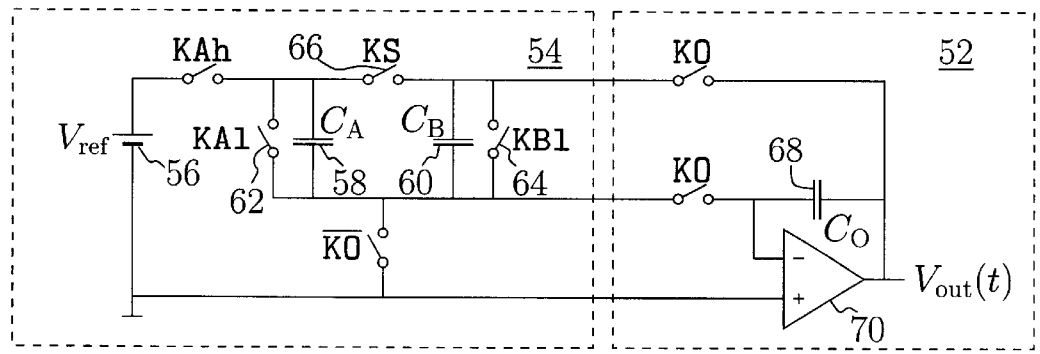
FIGURE 1 (PRIOR ART)
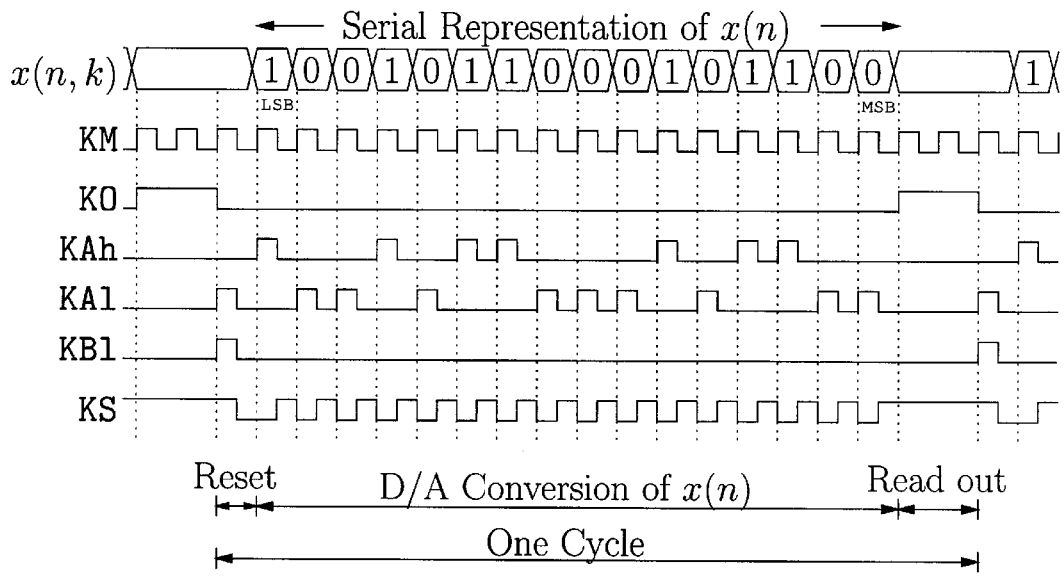
FIGURE 2 (PRIOR ART)
$$x(n) = \sum_{k=1}^{N} x(n,k) \cdot 2^{(k-N-1)}$$
$$v(n,k) = V_{\text{ref}} \cdot x(n,k) \cdot \frac{C_A}{C_A + C_B} + v(n,k-1) \cdot \frac{C_B}{C_A + C_B}$$
$$v_{\text{ideal}}(n,k) = V_{\text{ref}} \cdot \sum_{i=1}^{k} x(n,i) \cdot 2^{(i-k-1)}$$
$$y_{\text{ideal}}(n) = v_{\text{ideal}}(n,N) = V_{\text{ref}} \cdot x(n)$$
FIGURE 3 (PRIOR ART)

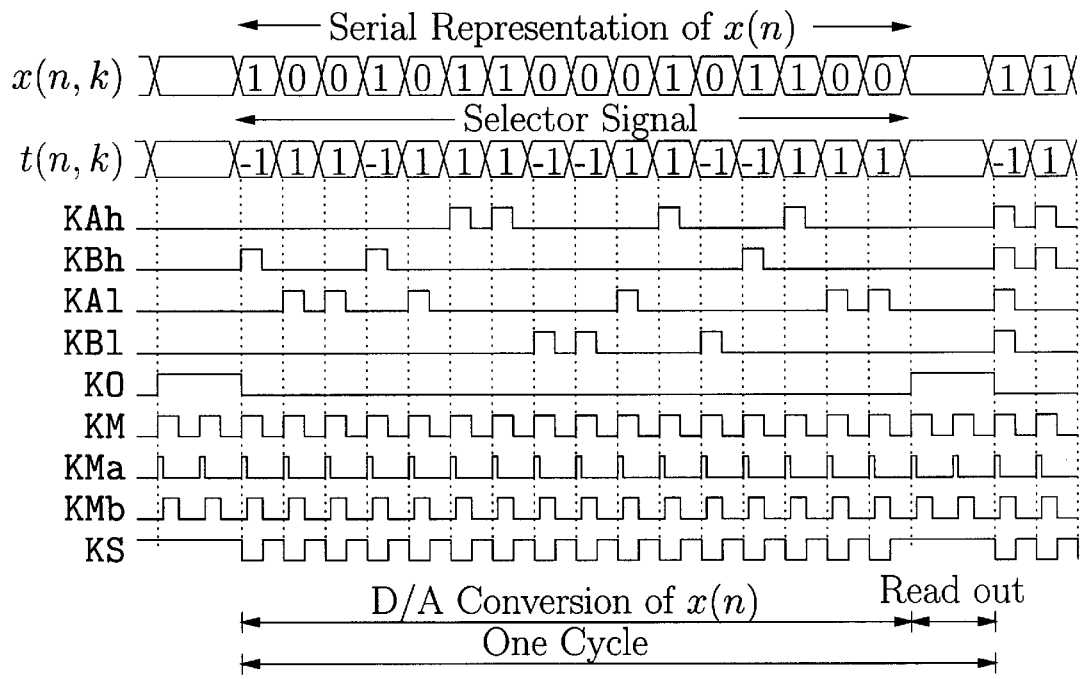

FIGURE 7

$$\delta = \frac{C_A - C_B}{C_A + C_B}$$

$$v(n,k) = \frac{V_{\text{ref}} \cdot x(n,k) + v(n,k-1)}{2} + t(n,k) \cdot \frac{\delta}{2}[V_{\text{ref}} \cdot x(n,k) - v(n,k-1)]$$

$$y(n) = v(n,N) = v_{\text{ideal}}(n,N) + \delta \cdot V_{\text{ref}} \sum_{k=1}^{N} t(n,k) \cdot \left[ x(n,k) \cdot 2^{(k-N-1)} - \sum_{i=1}^{k-1} x(n,i) \cdot 2^{(i-N-1)} \right]$$

FIGURE 8

$$y(n) = V_{\text{ref}} \cdot [x(n) + \delta \cdot e(n)]$$

$$e(n) = \sum_{k=1}^{N} t(n,k) \cdot b(n,k)$$

$$b(n,k) = x(n,k) \cdot 2^{(k-N-1)} - \sum_{i=1}^{k-1} x(n,i) \cdot 2^{(i-N-1)}$$

FIGURE 9

$$H_4(z) = \frac{1-\eta}{1-\eta \cdot z^{-1}}, \text{ where}$$
$$\eta = \frac{C_O + e^{(-T_{K0}/T_{RC})} \cdot (C_A + C_B)}{C_O + C_A + C_B} \text{ and } T_{RC} = \frac{R_O \cdot C_O \cdot (C_A + C_B)}{C_O + C_A + C_B}$$
$$H_{DT/CT}(s) = V_{ref} \cdot \frac{(1 - e^{(-s \cdot T_x)})}{s} \cdot \frac{(1 - e^{(-T_{K0}/T_{RC})} \cdot e^{(-s \cdot T_{K0})})}{(1 + s \cdot T_{RC})}$$
FIGURE 12
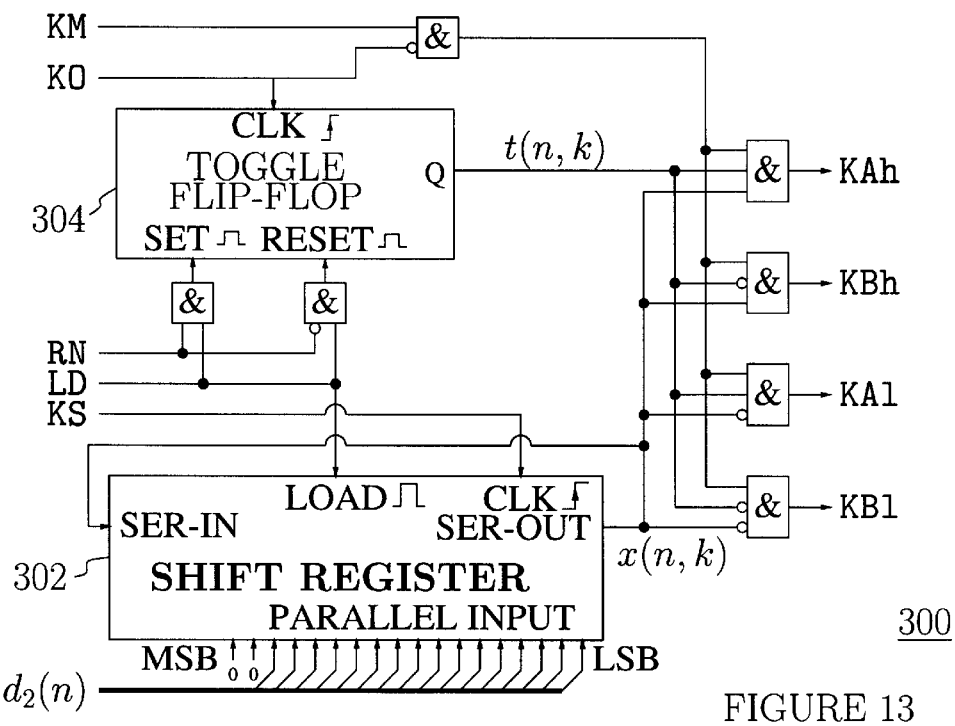
FIGURE 13
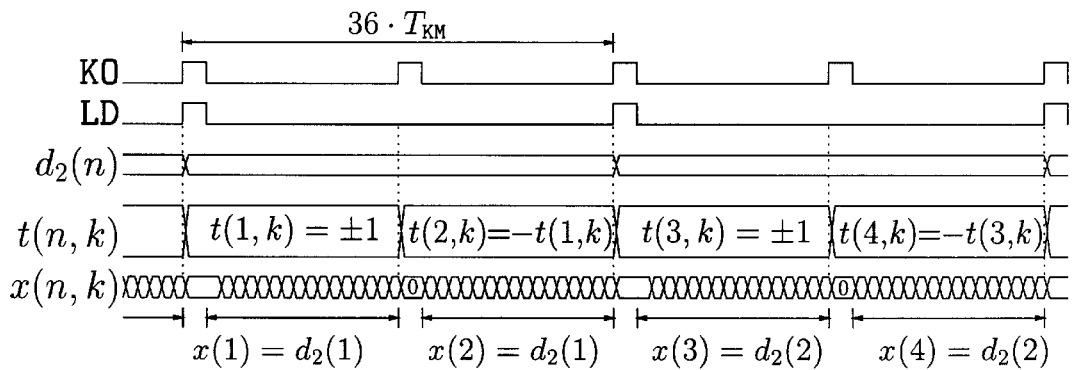
FIGURE 14

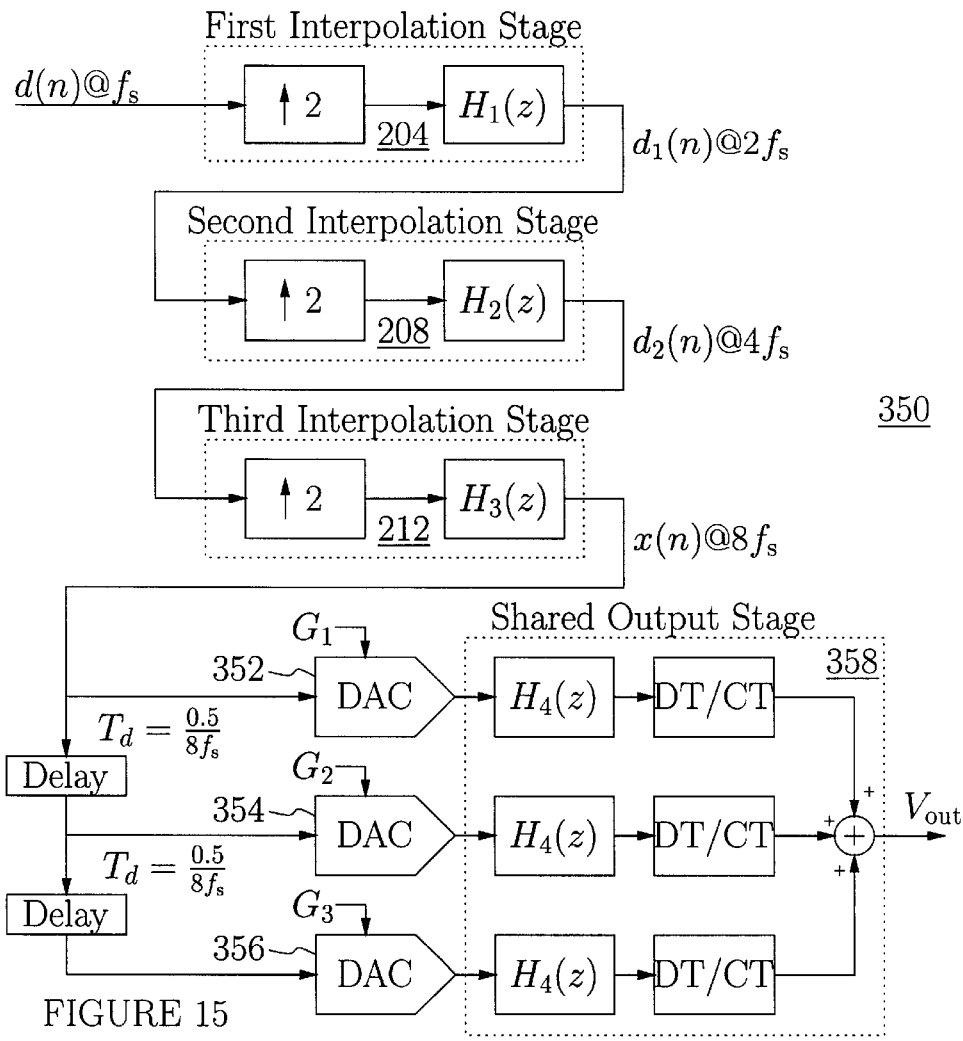

FIGURE 15

$$\frac{V_{out}(f)}{D_2(f)} = H_{FIR}(f) \cdot H_3(f) \cdot H_4(f) \cdot H_{DT/CT}(f)$$

$$H_{FIR}(f) = G_1 + G_2 \cdot z^{-1} + G_3 \cdot z^{-2}, \text{ where } z = e^{j2\pi f T_d} = e^{j2\pi f/16 f_s}$$

$$H_3(f) = 1 + z^{-1}, \text{ where } z = e^{j2\pi f/8 f_s}$$

$$H_4(f) = \frac{1-\eta}{1-\eta \cdot z^{-1}}, \text{ where } z = e^{j2\pi f/8 f_s}$$

$$H_{DT/CT}(f) = V_{ref} \cdot \frac{\left(1 - e^{(-s \cdot T_x)}\right)}{s} \cdot \frac{\left(1 - e^{(-T_{K0}/T_{RC})} \cdot e^{(-s \cdot T_{K0})}\right)}{(1 + s \cdot T_{RC})}$$

where $s = j2\pi f$

FIGURE 16

452  FIGURE 22  472

| k | MSB | | | | | | | | $m_1(k)$ | | | | | | | LSB |
|---|---|---|---|---|---|---|---|---|---|---|---|---|---|---|---|---|
| 1  | 0 | 0 | 0 | 0 | 0 | 0 | 0 | 0 | 0 | 0 | 0 | 0 | 0 | 0 | 0 | 1 |
| 2  | 0 | 0 | 0 | 0 | 0 | 0 | 0 | 0 | 0 | 0 | 0 | 0 | 0 | 0 | 1 | 0 |
| 3  | 0 | 0 | 0 | 0 | 0 | 0 | 0 | 0 | 0 | 0 | 0 | 0 | 0 | 1 | 0 | 0 |
| 4  | 0 | 0 | 0 | 0 | 0 | 0 | 0 | 0 | 0 | 0 | 0 | 0 | 1 | 0 | 0 | 0 |
| 5  | 0 | 0 | 0 | 0 | 0 | 0 | 0 | 0 | 0 | 0 | 0 | 1 | 0 | 0 | 0 | 0 |
| 6  | 0 | 0 | 0 | 0 | 0 | 0 | 0 | 0 | 0 | 0 | 1 | 0 | 0 | 0 | 0 | 0 |
| 7  | 0 | 0 | 0 | 0 | 0 | 0 | 0 | 0 | 0 | 1 | 0 | 0 | 0 | 0 | 0 | 0 |
| 8  | 0 | 0 | 0 | 0 | 0 | 0 | 0 | 0 | 1 | 0 | 0 | 0 | 0 | 0 | 0 | 0 |
| 9  | 0 | 0 | 0 | 0 | 0 | 0 | 0 | 1 | 0 | 0 | 0 | 0 | 0 | 0 | 0 | 0 |
| 10 | 0 | 0 | 0 | 0 | 0 | 0 | 1 | 0 | 0 | 0 | 0 | 0 | 0 | 0 | 0 | 0 |
| 11 | 0 | 0 | 0 | 0 | 0 | 1 | 0 | 0 | 0 | 0 | 0 | 0 | 0 | 0 | 0 | 0 |
| 12 | 0 | 0 | 0 | 0 | 1 | 0 | 0 | 0 | 0 | 0 | 0 | 0 | 0 | 0 | 0 | 0 |
| 13 | 0 | 0 | 0 | 1 | 0 | 0 | 0 | 0 | 0 | 0 | 0 | 0 | 0 | 0 | 0 | 0 |
| 14 | 0 | 0 | 1 | 0 | 0 | 0 | 0 | 0 | 0 | 0 | 0 | 0 | 0 | 0 | 0 | 0 |
| 15 | 0 | 1 | 0 | 0 | 0 | 0 | 0 | 0 | 0 | 0 | 0 | 0 | 0 | 0 | 0 | 0 |
| 16 | 1 | 0 | 0 | 0 | 0 | 0 | 0 | 0 | 0 | 0 | 0 | 0 | 0 | 0 | 0 | 0 |

| k | MSB | | | | | | | | $m_2(k)$ | | | | | | | LSB |
|---|---|---|---|---|---|---|---|---|---|---|---|---|---|---|---|---|
| 1  | 0 | 0 | 0 | 0 | 0 | 0 | 0 | 0 | 0 | 0 | 0 | 0 | 0 | 0 | 0 | 0 |
| 2  | 0 | 0 | 0 | 0 | 0 | 0 | 0 | 0 | 0 | 0 | 0 | 0 | 0 | 0 | 0 | 1 |
| 3  | 0 | 0 | 0 | 0 | 0 | 0 | 0 | 0 | 0 | 0 | 0 | 0 | 0 | 0 | 1 | 1 |
| 4  | 0 | 0 | 0 | 0 | 0 | 0 | 0 | 0 | 0 | 0 | 0 | 0 | 0 | 1 | 1 | 1 |
| 5  | 0 | 0 | 0 | 0 | 0 | 0 | 0 | 0 | 0 | 0 | 0 | 1 | 1 | 1 | 1 | 1 |
| 6  | 0 | 0 | 0 | 0 | 0 | 0 | 0 | 0 | 0 | 0 | 1 | 1 | 1 | 1 | 1 | 1 |
| 7  | 0 | 0 | 0 | 0 | 0 | 0 | 0 | 0 | 0 | 1 | 1 | 1 | 1 | 1 | 1 | 1 |
| 8  | 0 | 0 | 0 | 0 | 0 | 0 | 0 | 0 | 1 | 1 | 1 | 1 | 1 | 1 | 1 | 1 |
| 9  | 0 | 0 | 0 | 0 | 0 | 0 | 0 | 1 | 1 | 1 | 1 | 1 | 1 | 1 | 1 | 1 |
| 10 | 0 | 0 | 0 | 0 | 0 | 0 | 1 | 1 | 1 | 1 | 1 | 1 | 1 | 1 | 1 | 1 |
| 11 | 0 | 0 | 0 | 0 | 0 | 1 | 1 | 1 | 1 | 1 | 1 | 1 | 1 | 1 | 1 | 1 |
| 12 | 0 | 0 | 0 | 0 | 1 | 1 | 1 | 1 | 1 | 1 | 1 | 1 | 1 | 1 | 1 | 1 |
| 13 | 0 | 0 | 0 | 1 | 1 | 1 | 1 | 1 | 1 | 1 | 1 | 1 | 1 | 1 | 1 | 1 |
| 14 | 0 | 0 | 1 | 1 | 1 | 1 | 1 | 1 | 1 | 1 | 1 | 1 | 1 | 1 | 1 | 1 |
| 15 | 0 | 1 | 1 | 1 | 1 | 1 | 1 | 1 | 1 | 1 | 1 | 1 | 1 | 1 | 1 | 1 |
| 16 | 1 | 1 | 1 | 1 | 1 | 1 | 1 | 1 | 1 | 1 | 1 | 1 | 1 | 1 | 1 | 1 |

Rough Numeric Estimates of $b(n, k)$

| $x(n)$ | $b(n, 16)$ | $b(n, 15)$ | $\sum_{k=2}^{N} |b(n, k)|$ |
|---|---|---|---|
| 00... | −1/8 | −1/8 | +1/16 |
| 01... | −3/8 | +1/8 | +1/16 |
| 10... | +3/8 | −1/8 | +1/16 |
| 11... | +1/8 | +1/8 | +1/16 |

Logic Values of $t(n, 16)$, $t(n, 15)$, $s(n)$

| $x(n)$ | Expected approximate value of $e(n)$ | | | | | | | | | |
|---|---|---|---|---|---|---|---|---|---|---|
| | −9/16 | −7/16 | −5/16 | −3/16 | −1/16 | 1/16 | 3/16 | 5/16 | 7/16 | 9/16 |
| 00... | | | 1,1,0 | 1,1,1 | 1,0,0 | 0,1,1 | 0,0,0 | 0,0,1 | | |
| 01... | 1,0,0 | 1,0,1 | 1,1,0 | 1,1,1 | | | 0,0,0 | 0,0,1 | 0,1,0 | 0,1,1 |
| 10... | 0,1,0 | 0,1,1 | 0,0,0 | 0,0,1 | | | 1,1,0 | 1,1,1 | 1,0,0 | 1,0,1 |
| 11... | | | 0,0,0 | 0,0,1 | 0,1,0 | 1,0,1 | 1,1,0 | 1,1,1 | | |

SERIAL D/A CONVERTER COMPENSATING FOR CAPACITOR MISMATCH ERRORS

RELATED APPLICATION DATA

This invention is based on and claims priority from U.S. Provisional Patent Application No. 60/112,507, "Two-Capacitor Digital-to-Analog Converter" filed Dec. 14, 1998; from U.S. Provisional Patent Application No. 60/149,829, "Charge-Sharing Digital-to-Analog Converter" filed Aug. 19, 1999; and from PCT application PCT/DK99/00700 filed Dec. 14 1999.

FIELD OF INVENTION

The field of invention is data conversion, more particularly, this invention relates to low-power digital-to-analog signal converters.

DESCRIPTION OF PRIOR ART

Modern CMOS integrated circuit technologies facilitate the cost-effective implementation of high-density digital circuits. Digital signal processing (DSP) is thus an attractive way to process signals, including audio signals. When using DSP the achievable performance is limited exclusively by the analog-to-digital (A/D) and digital-to-analog (D/A) converters employed. Products such as compact-disc (CD), mini-disc, and digital-audio-tape (DAT) playback units require low-cost highly-linear D/A converters for their mass production.

A particularly simple D/A converter system [50] is shown in FIG. 1. In IEEE Journal of Solid-State Circuits, SC-10, December, 1975, Suarez et al. described a successive-approximation A/D converter employing internally a similar D/A converter for feedback. The operation is best described considering also the timing diagram shown in FIG. 2. Each conversion cycle consists of a reset period; a D/A conversion period; and a read-out period wherein the generated analog signal y(n) is provided to the output stage [52]. The D/A converter's core [54] consists of a reference voltage source [56]; two nominally identical capacitors [58][60]; and a handful of switches. The D/A converter core [54] generates a voltage signal stored on the capacitors [58][60] at the end of the D/A conversion period. During the reset period, the capacitors [58][60] are discharged by two switches [62][64]. The digital word to be converted, x(n), is of N-bit resolution, where N=16. The individual bits are denoted x(n, 1), x(n, 2), ..., x(n, N), where x(n, 1) is the least significant bit and x(n, N) is the most significant bit of x(n). The D/A conversion period consists of N sub-periods; one for each bit x(n, k), where k=1, 2, ..., N. The DAC system [50] is synchronized by a master clock signal KM. When KM is logically "high," the driving capacitor [58] is either discharged or charged to $V_{ref}$ according to the value of the corresponding bit signal x(n, k). The bit signals x(n, k) are used sequentially, starting with the least significant bit x(n, 1). A switch [66] is closed in a non-overlapping period KS when KM is logically "low," whereby the isolated charge portions will distribute among the two capacitors [58][60] according to the ratio of their capacitances: $C_A$ and $C_B$.

Define v(n, k) as the voltage across the capacitors [58][60] in the kth sub-period when the switch [66] is closed. FIG. 3 shows a set of equations characterizing the operation of the D/A converter core [54]. The input digital word, x(n), is encoded as an unsigned binary-weighted number in the range from 0 to 1. The bit signals x(n, k) each attain only the values 0 and 1. The superposition principle explains that v(n, k) will be a fraction, $C_A/(C_A+C_B)$, of the voltage, $V_{ref}$x(n, k), on the driving capacitor [58] plus a fraction, $C_B/(C_A+C_B)$, of the voltage, v(n, k−1), on the storing capacitor [60] evaluated immediately before the switch [66] is closed. The reset operation assures that v(n, 0)=0. Recursive use of the redundant expression for v(n, k) leads to the conclusion that the generated voltage signal, y(n)=v(n, 16), ideally will attain the value y(n)=$V_{ref}$x(n), provided that $C_A$=$C_B$.

In the read-out period, when the control signal KO is logically "high," the capacitors [58][60] are connected in parallel with the output stage's [52] feedback capacitor [68]. The operational amplifier [70] (opamp) drives directly the load (not shown), i.e., the output signal $V_{out}(t)$ is evaluated as a continuous-time signal. Notice that $V_{out}(t)$ is a low-pass filtered representation of y(n). The low complexity and low power consumption of this D/A converter system [50] makes it very suitable for use in portable audio equipment. However, the human ear is a very delicate sensor capable of detecting even very small errors. Distortion and spurious tones more powerful than −100 dB relative to full scale is not acceptable. The capacitors [58][60] must match very well to achieve this level of spectral purity. Sufficiently good matching can generally not be obtained using a standard CMOS integrated-circuit technology. Post-production calibration can be used to improve the capacitor matching, but it will significantly increase the production costs and re-calibration may be necessary after a period of operation. The reference voltage source [56] is another possible source of deleterious errors. If the voltage source's [56] output impedance is finite, the multiplicative reference voltage $V_{ref}$ will be modulated by the charge signal it provides. This effect may cause errors that are easily detectable by the human ear, unless the voltage source [56] is well regulated. Unfortunately, the implementation of an efficient regulation of the voltage source [56] will increase the overall power consumption considerably.

SUMMARY

A digital-to-analog converter comprising a reference voltage source; a symmetrical network of switches and capacitors; and a digital state machine to control the switches. The general symmetry and the signal-independent load of the reference voltage source suppresses efficiently errors due to charge injection, clock feed-through, and reference-voltage modulation. The digital state machine controls the switches such as to suppress deleterious errors due to mismatch of the capacitors.

OBJECTS AND ADVANTAGES

Accordingly, several objects and advantages of this invention are:

- to provide low-cost digital-to-analog (D/A) converters suitable for use in portable audio applications;
- to provide general-purpose, low-power, highly-linear D/A converters;
- to provide linear D/A converters not relying on accurate matching of electrical parameters;
- to provide mismatch-shaping D/A converters needing only a minimum of oversampling;
- to provide D/A converters utilizing passive analog-domain interpolation, thus increasing the signal bandwidth without increasing the power consumption;
- to provide D/A converters systems requiring only one operational amplifier.

Further objects and advantages will become apparent from a consideration of the ensuing description, the drawings, and the claims.

3

DRAWING FIGURES.

FIG. 1: shows a simple charge-sharing digital-to-analog converter (PRIOR ART).

FIG. 2: shows a timing diagram for the D/A converter [50] (PRIOR ART).

FIG. 3: shows a set of equations representing the ideal operation of the D/A converter [50].

FIG. 4: shows a differential charge-sharing D/A converter with time-invariant load of the reference voltage source [114].

Figure 5:
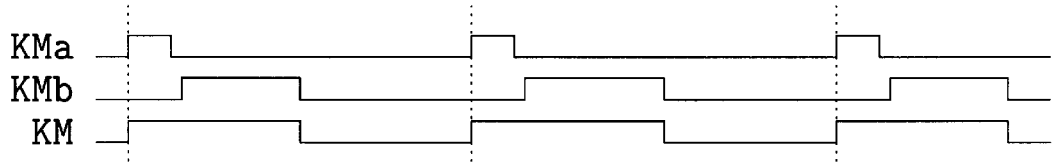

FIG. 5: shows a timing diagram for the clock phases KMa and KMb.

Figure 6:
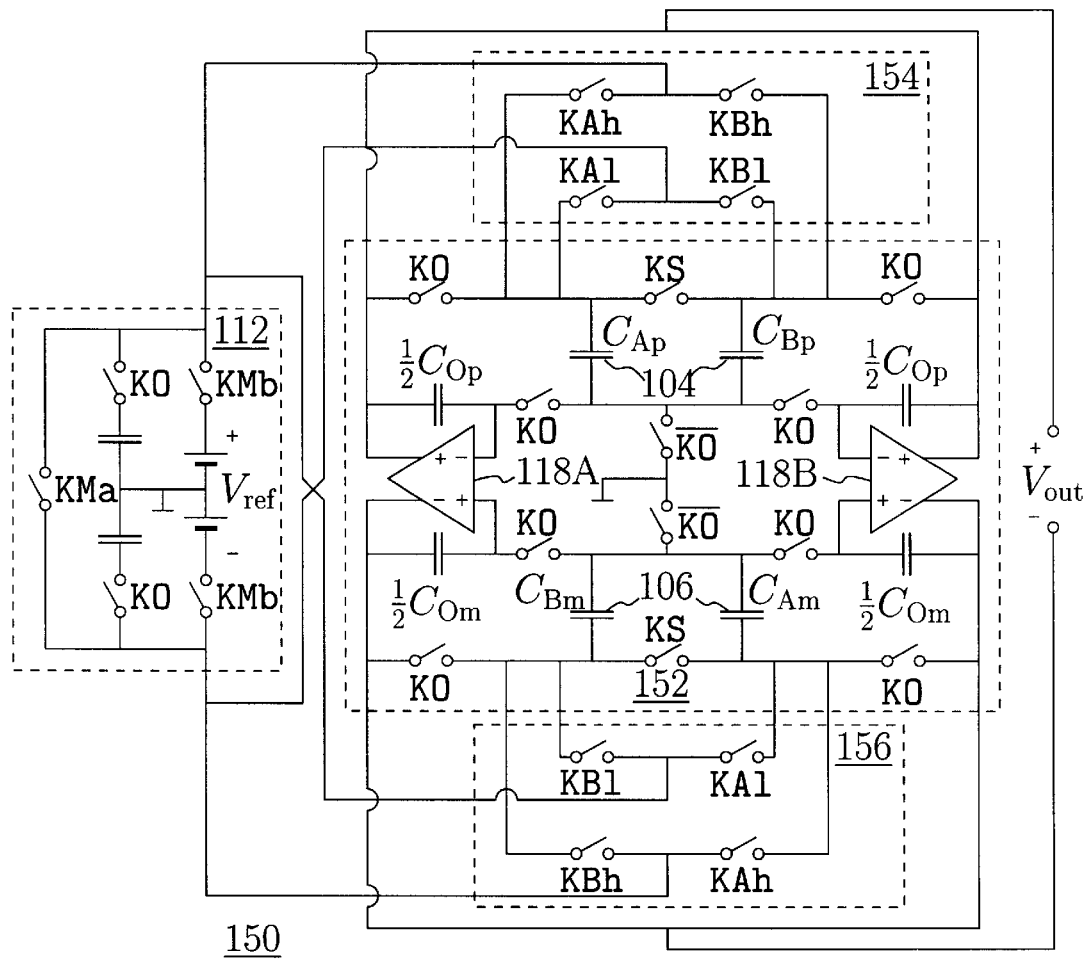

FIG. 6: shows a fully-symmetrical version of the D/A converter [100].

FIG. 7: shows a timing diagram for the D/A converter [150].

FIG. 8: shows a set of equations representing the D/A converter [150].

FIG. 9: shows a set of compact equations representing the D/A converter [150].

Figure 10:
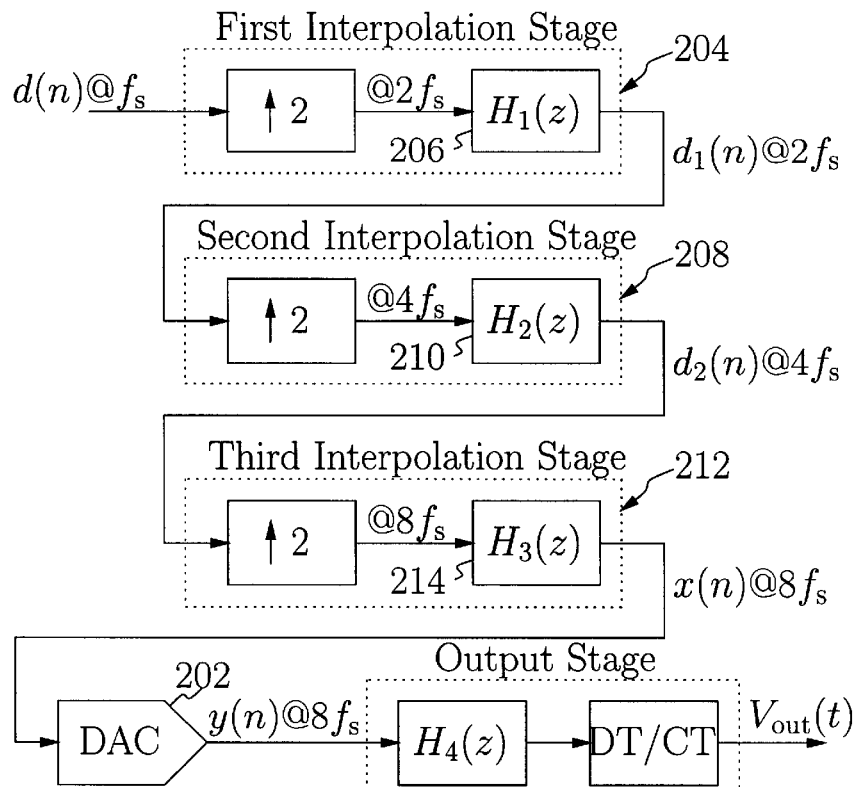

FIG. 10: shows the full D/A converters system, including the preceding interpolation filter.

Figure 11:
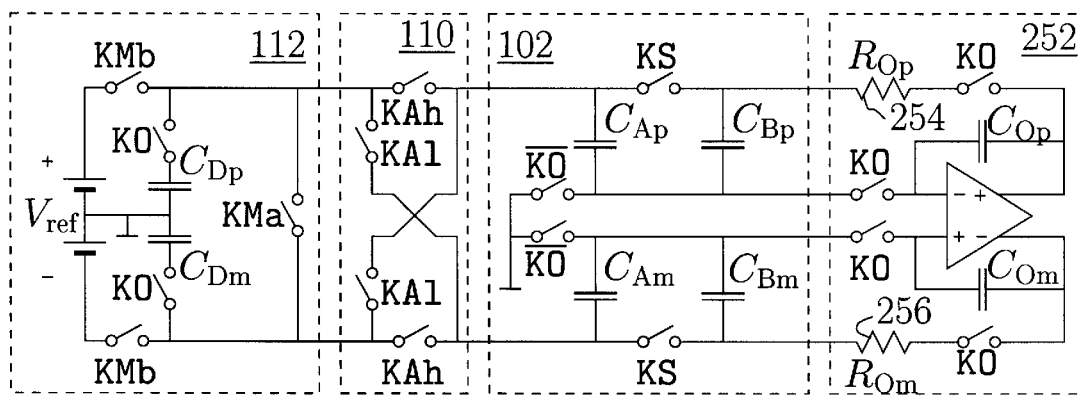

FIG. 11: shows the D/A converter [100] with a modified output stage [252].

FIG. 12: shows a set of equations modeling the output stage's [252] behavior.

FIG. 13: shows a digital state machine used to generate the control signals KAh, KA1, KBh, KB1.

FIG. 14: shows a timing diagram for the D/A converter [150] driven by the state machine [300].

FIG. 15: shows a D/A converter system employing analog-domain interpolation.

FIG. 16: shows a set of equations modeling the behavior of the DAC system [350].

Figure 17:
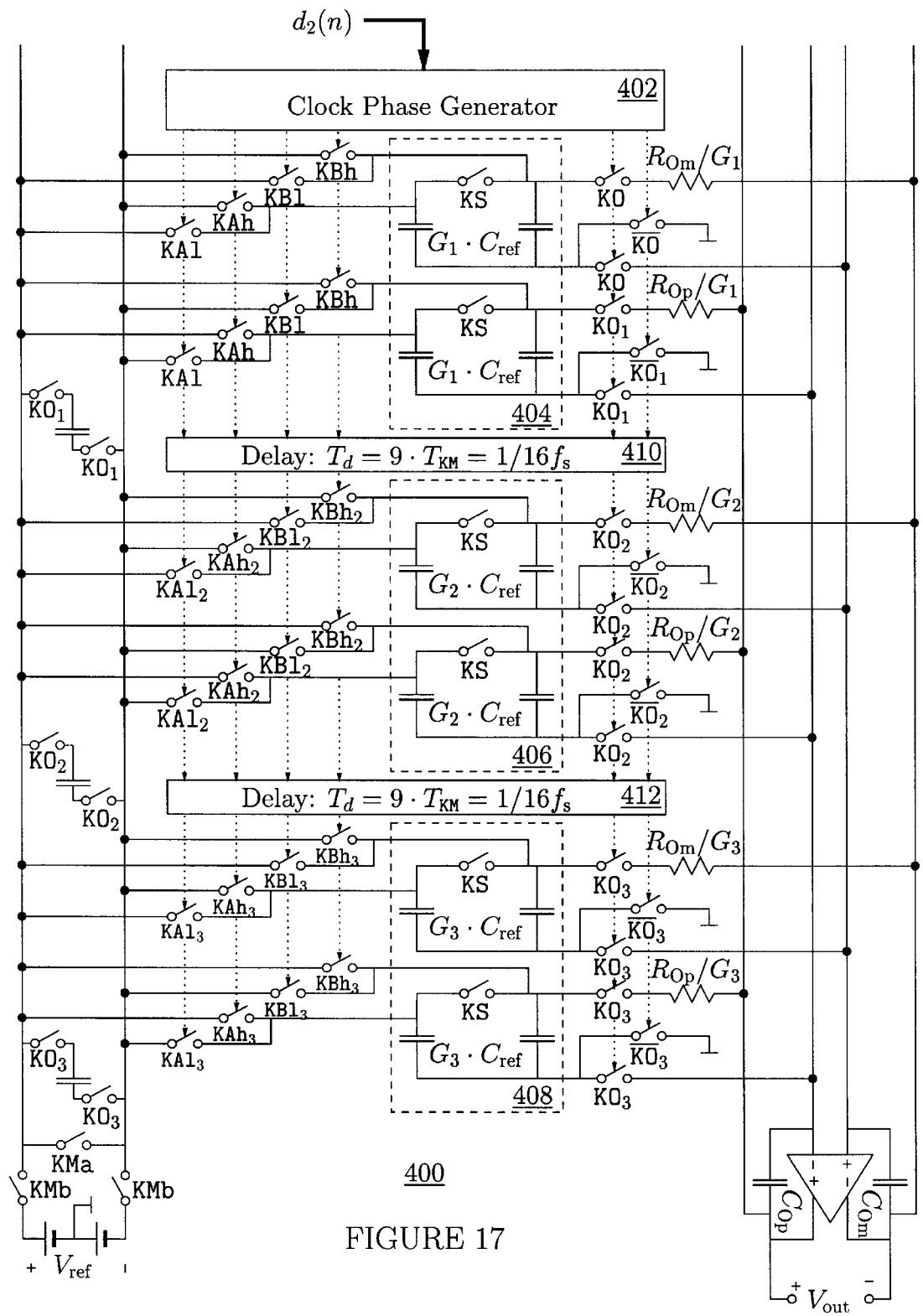

FIG. 17: shows the core D/A converter circuit used in the DAC system [350].

Figure 18:
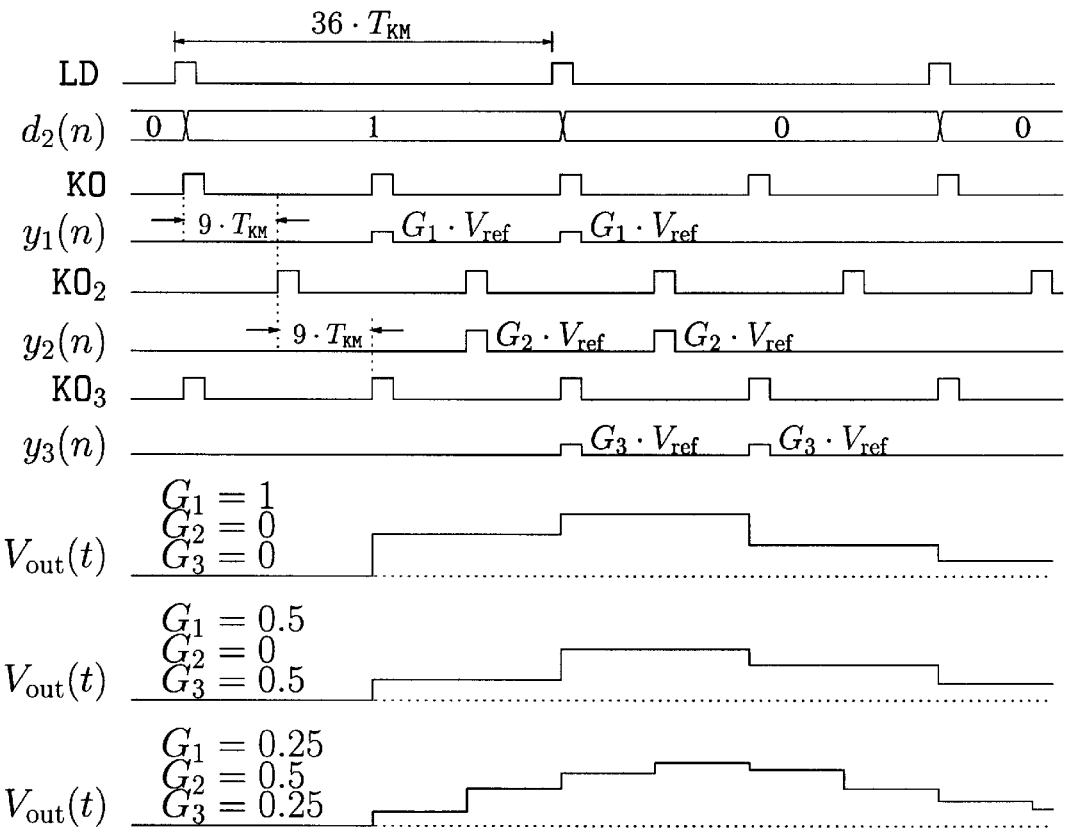

FIG. 18: shows the impulse responses for three sets of parameters for the DAC system [350].

Figure 19:
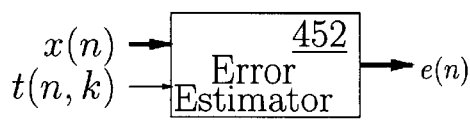

FIG. 19: shows an error estimator calculating e(n) from x(n) and t(n, k).

Figure 20:

FIG. 20: shows a switching selector generating t(n, k) such that e(n) will be approximately w(n).

Figure 21:
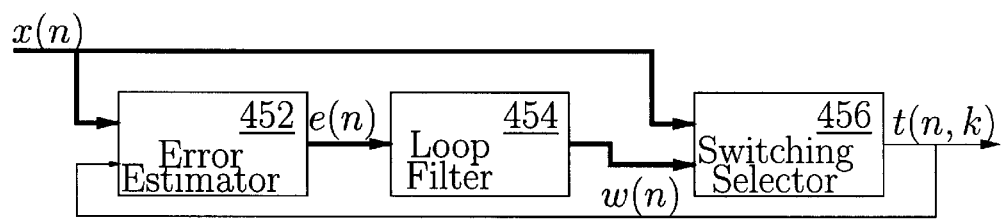

FIG. 21: shows the selector-signal generator for a mismatch-shaping D/A converter [150].

FIG. 22: shows an implementation of the error estimator [452].

Figures 23, 24:
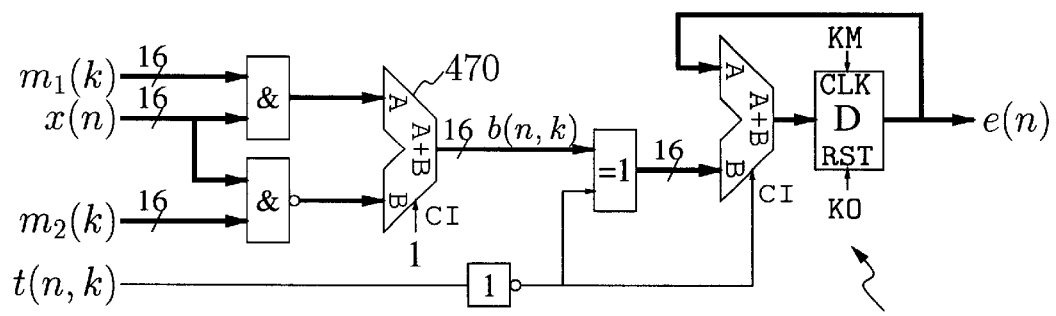

FIG. 23: shows a truth table for the first masking signal $m_1$(k).

FIG. 24: shows a truth table for the second masking signal $m_2$(k).

Figures 25, 26, 27:
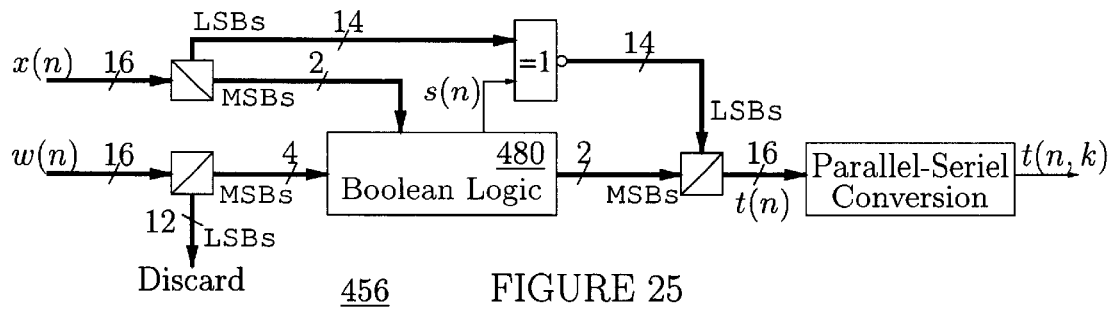

FIG. 25: shows the switching selector [456].

FIG. 26: shows rough estimates of the basis signals b(n, k).

FIG. 27: shows how to choose the three signals, t(n, 16), t(n, 15), and s(n).

Figure 28:
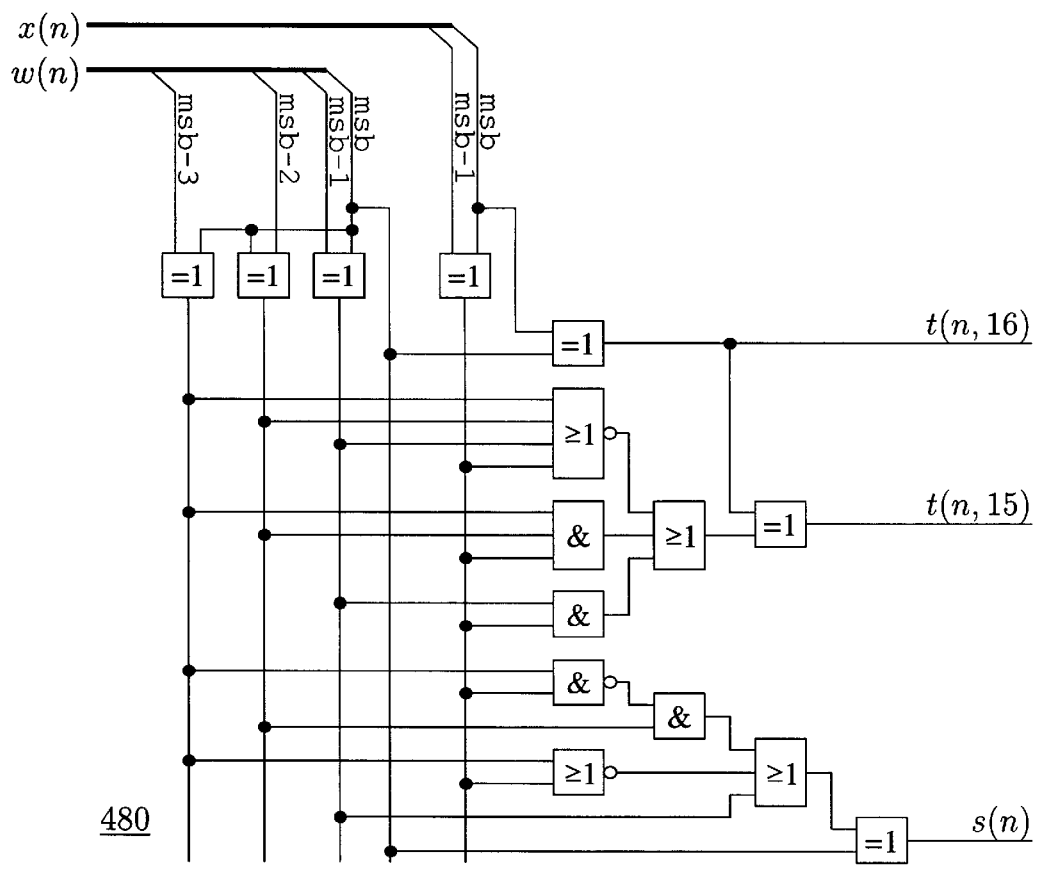

FIG. 28: shows the digital-logic network [480] employed in the switching selector [456].

Figure 29:
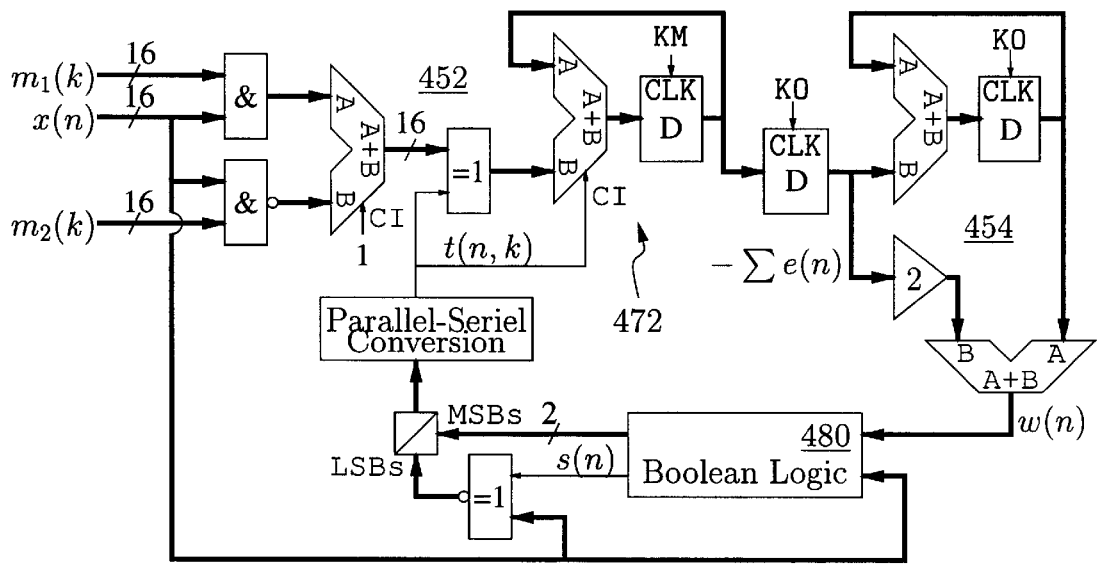

FIG. 29: shows an implementation of the selector-signal generator [450].

DESCRIPTION of PREFERRED EMBODIMENTS

D/A converters [50] of the type shown in FIG. 1, which are used to convert signals rather than uncorrelated streams of data, need not be reset at the beginning of each conversion cycle. Excluding the reset period will not introduce distortion, but merely alter the signal transfer function insignificantly. To keep the complexity at a minimum, the reset operation has been omitted in the preferred embodiments discussed below.

FIG. 4 shows a fully-differential D/A converter [100] according to this invention. A block of switched capacitors [102] comprises a first (positive) pair [104] and a second (negative) pair of matched capacitors [106]. The differential voltage generated on these capacitors [104][106] is provided to the differential output stage [108] during clock phase KO. An advantage of the fully-differential operation is that the capacitors [104][106] during the charging phases KM can be charged to $+V_{ref}$ and $-V_{ref}$, instead of $+V_{ref}$ and 0. A block of four switches [110] is used to controllably invert, as a function of x(n, k), the polarity of the reference voltage signal provided by the driving circuit [112]. The capacitive load $(C_{Ap} \cdot C_{Am})/(C_{Ap}+C_{Am})$ seen by the driving circuit [112] is thus independent of the digital signal x(n, k). The two driving capacitors, $C_{Ap}$ and $C_{Am}$, are discharged in a first fraction KMa of each charging period KM. They are since charged to $V_{ref}$ in a second non-overlapping fraction KMb of KM. The charge provided by the reference voltage source [114] is thus independent of x(n, k). Accordingly, the reference voltage source [114] need not be well regulated; a simple low-pass filtering of the voltage provided by the power-supply battery (not shown) with a passive RC low-pass filter (not shown) will often suffice. FIG. 5 shows the clock phases KMa and KMb relative to KM. All the other control signals are shown in FIG. 2.

Ideally the charge signal provided by the reference voltage source [114] should not only be independent of x(n), it should preferably also be time-invariant. The periodic sequence of uniform charge pulses provided to the capacitors [104][106] is interrupted during the read-out period KO when the capacitors [104][106] are connected to the output stage [108]. However, dummy capacitors [116] engaged only during KO are used to make the load seen by the reference voltage source [114] time-invariant. The dummy capacitors [116] are nominally identical to the main capacitors [104][106].

Several types of errors, including clock-feedthrough and charge-injection errors, are canceled out when the DAC circuit [100], and particularly the capacitor block [102], is made symmetrical. In that sense it is not optimal that the capacitor block [102] is "driven from the left" and "loaded to the right." The circuit should preferably be made physically and electrically symmetrical to the widest possible extent. The symmetry aspect should be considered very carefully when the layout of the circuit is performed. FIG. 6 shows a D/A converter system [150] with an improved symmetry. The capacitor block [102] and the output stage [108] is here merged to one symmetrical circuit block [152]. The output stage's opamp [118] is split in two smaller opamps [118A][118B] operating in parallel. Although the input terminals of the two opamps [118A][118B] are not connected in parallel, they very well could be. The main aspect is that the matched capacitor pairs [104][106] are loaded symmetrically by the opamps [118A][118B] and the switches connecting them. The polarity-inverting block of switches [110] is replaced by two blocks of switches [154][156], which are symmetrical with respect to the matched capacitor pairs [104][106]. Notice that the circuit [152] is physically and electrically symmetrical during clock phases KS. Hence, the nominal operation is not affected by which of the two capacitors in each capacitor pair [104][106] that is used as the driving capacitor, and which capacitor that is used for storing v(n, k). Assume that a selector signal t(n, k) is generated, and that the switches [154][156] are operated as follows. In charging phases KM where t(n, k) is logically "high," the capacitors $C_{Ap}$ and $C_{Am}$ are used as the driving ones. Similarly, in charging phases KM where t(n, k) is logically "low," the capacitors $C_{Bp}$ and $C_{Bm}$ are used as the driving ones. This mode of operation is illustrated by the timing diagram shown in FIG. 7.

The selector signal t(n, k) does not change the nominal operation, but it affects the errors caused by mismatch of the supposedly matched capacitor pairs [104][106]. FIG. 8 shows a set of equations reflecting the selector signal's influence. For simplicity, the mismatch of the capacitor pairs [104][106] is represented by a mismatch parameter δ, where $C_A=C_{Ap}+C_{Am}$ and $C_B=C_{Bp}+C_{Bm}$. The mismatch parameter δ is used to rewrite the expression for v(n, k) from the equation set shown in FIG. 3, while remembering to take t(n, k) into account. This mathematical representation assumes that t(n, k) attains only the numeric values 1 (for logic "high") and −1 (for logic "low"). The expression for v(n, k) is used to derive the general expression for y(n). The general expression for y(n) is repeated by the set of equations shown in FIG. 8, which is a more compact and logical representation. The following observations should be made:

1. the error $V_{ref}\cdot\delta\cdot e(n)$ comprised in y(n) is proportional to the mismatch parameter δ;
2. the normalized error e(n) is a plus-minus sum of a set of basis signals b(n, k), which depend exclusively on the digital input signal x(n).

An objective of this invention is to avoid performance degradation due to the mismatch-induced error $V_{ref}\cdot\delta\cdot e(n)$. Instead of reducing the mismatch parameter δ, which would require a costly calibration, the objective is to generate the selector signal t(n, k) such that e(n) is reduced. Several preferred embodiments are described below.

First Preferred Embodiment

In a first preferred embodiment, the selector signal t(n, k) is generated as a random sequence using a possibly very simple random generator (not shown). Because t(n, k) is uncorrelated with x(n), the normalized error e(n) will also be uncorrelated with x(n). In other words, the mismatch-induced error will be a noise-like error signal. It can be shown that the mismatch-induced error noise's power spectral density (PSD) is uniform. The mismatch-induced error signal is thus somewhat similar to thermal noise, which always is present in analog sampled-data systems. The mismatch-induced noise's power will unfortunately be generally 10–20 dB higher than the thermal noise's power (for a yielding implementation in a modern CMOS technology). This very simple technique should thus only be used if δ can be made small. The mismatch parameter δ can be reduced by increasing the capacitors' [104][106] capacitance, but that will also increase the power consumption.

Second Preferred Embodiment

It requires only very little additional hardware to modify the first preferred embodiment to obtain the efficient suppression of e(n) that characterizes a second preferred embodiment. The general idea is to reduce in the signal band the power spectral density of the normalized error noise signal e(n). In other words, the second preferred embodiment is a so-called mismatch-shaping D/A converter.

For nearly all practical applications, x(n) will be an oversampled signal. Often x(n) will be generated by interpolation of a Nyquist-sampled signal d(n). FIG. 10 shows a complete D/A converter system [200]. The input signal d(n) can, e.g., be the information (audio signal) stored on a compact disc (CD), in which case the sampling frequency $f_S$ is 44.1 kHz. Regardless of how the D/A converter [202] is implemented, it is preferable to interpolate a Nyquist-sampled signal d(n) before it is D/A converted. This is because any Nyquist-sampled signal may comprise large spectral components close in frequency to the signal-band spectral components representing the signal to be extracted. If d(n) was D/A converted directly, a very complicated analog filter would be required to isolate the desired spectral components. The interpolation of d(n) to x(n) reflects that digital filters are simpler to implement than analog ones.

A three-stage interpolation process is used for the D/A converter system [200]. The first interpolation stage [204] inserts zeros in between the samples of d(n), thereby increasing the sampling frequency by a factor of two. The generated signal is then filtered by a half-band filter [206] with transfer function $H_1(z)$. The half-band filter [206] generally has a relatively narrow transition band and thus must be of high order; an FIR filter with 4096 tabs is often used for CD audio systems. The second interpolation stage [208] is similar to the first one [204], except for the difference that the second half-band filter [210] is of relatively much lower order than the first one [206], reflecting that its transition band is relatively much wider. The filter [214] employed in the last interpolation stage [212] is generally very simple. It is often an FIR filter of very low order, say, $H_3(z)=1+z^{-1}$. Unwanted, large spectral components comprised in the analog equivalent y(n) of x(n) are relatively distant in frequency from the wanted, signal-band spectral components in y(n). The unwanted spectral components are suppressed partly by the discrete-time analog signal processing that results from charge sharing during KO. In FIG. 10, this part of the signal processing performed is represented by the transfer function $H_4(z)$. The discrete time to continuous-time (DT/CT) conversion $H_{DT/CT}(s)$ also suppresses unwanted spectral components comprised in y(n). When the output stage is implemented as shown in FIGS. 4 and 6, the DT/CT conversion is nominally a zero-order holding one, i.e., $H^{DT/CT}(s)=(1-e^{-S\cdot T_x})/s$, where $T_x$ is the duration of each conversion cycle. A zero-order holding DT/CT conversion results in a staircase output signal $V_{out}(t)$, which requires the opamp [118][118B][118A] to have a linear high-frequency response. To avoid this requirement, a nominally continuous output signal $V_{out}(t)$ is preferable. FIG. 11 shows a modified version [250] of the D/A converter [100] from FIG. 4. The only modification is the two resistors [254][256] included in the modified output stage [252]. The discrete-time transfer function $H_4(z)$ remains to be a first-order one, but the order of the DT/CT conversion $H_{TD/CT}(S)$ has increased by one. Equations describing the modified output stage [252] are shown in FIG. 12. The RC time constant, TRC, should preferably be larger than the time constant describing the opamp's unity-gain frequency. Considering that the factor $e^{(-T_{KO}/T_{RC})}$ preferably should be small, ideally zero, it may be concluded that the duration, $T_{KO}$, of the read-out period KO should not be made too short. Opamps of the type described in the patent application PCT/IB99/01279 may be used for demanding applications, in which case the opamp's unity-gain frequency may be lower than $1/(2\pi\cdot T_{KO})$.

The main aspect of how to generate the selector signal t(n, k) to obtain mismatch-shaping operation will now be addressed. The above description of the interpolation process was necessary because the way in which the selector signal is generated is closely related to the properties of the last interpolation stage [212]. The last-stage interpolation filter [214] is characterized by $H_3(z)=1+z^{-1}$, i.e., each sample of $d_2(n)$@196.4 kHz is simply repeated twice to generate x(n)@392.8 kHz. The signal x(n) will thus be of the type:

$$x(n)=\ldots,x_1,x_1,x_2,x_2,x_3,x_3,x_4,x_4,\ldots$$

where, ..., $x_1$, $x_2$, $x_3$, $x_4$, ... is a sequence of samples from $d_2$ (n). Let the index n for x(n) be defined such that x(n)=x(n+1) for all odd n. For any selector signal that fulfills t(n, k)=−t(n+1, k) for all odd n, the normalized error signal e(n) will be of the form:

$$e(n)=\ldots,e_1,-e_1,e_2,-e_2,e_3,-e_3,e_4,-e_4,\ldots,$$

which is the first-order difference of a signal $$q(n)=\ldots,e_1,0,e_2,0,e_3,0,\ldots.$$

Ideally q(n) will be a noise-like signal with uniform PSD, i.e., q(n) should be uncorrelated with x(n). This property can be easily obtained by choosing t(n, k) randomly for odd values of n. In the considered, particularly simple special case, t(n, k) is independent of k, i.e., t(n, k) is held constant during the conversion of each sample z(n).

FIG. 13 shows a low-complexity digital state machine [300] that implements the last interpolation stage [212] and generates the selector signal t(n, k) and the control signals KAh, KA1, KBh, KB1. A corresponding timing diagram is shown in FIG. 14. The control signal LD is synchronized with the master clock signal KM and the read-out clock signal KO. When LD is logically "high," the input signal $d_2(n)$ is loaded parallelly into an 18-bit parallel-load, serial-in, serial-out shift register [302]. The LSB of $d_2(n)$ is loaded into the register closest to the serial output, and arbitrary values (here zeros) are loaded into the excess two MSB registers which are closest to the serial input. The duration of the load period LD is $2 \cdot T_{KM}$ (two periods of KM). The 18 bits stored in the shift register [302] are shifted cyclically during the next 34 master clock cycles KM following LD. During the first 16 of the 34 clock cycles, the first of two identical samples of x(n) is piped out serially; then follows a read-out period of two clock cycles wherein KO is logically "high;" finally, during the last 16 of the 34 clock cycles, the second of the two identical samples of x(n) is piped out serially. During the load period LD, a toggle flip-flip [304] is set to either logically "high" or "low," according to the logical value of a pseudo-random signal RN provided by a possibly simple random generator (not shown). The flip-flop [304] is clocked on the rising edges of KO, whereby the generated selector signal t(n, k) will attain opposite logical values when the two identical samples of x(n) are piped out of the shift register [302]. The control signals KAh, KAl, KBh, and KBl are generated as simple boolean functions of KM, KO, and the generated signals: t(n, k) and x(n, k).

In a variation of this embodiment, the last interpolation stage [212] is characterized by $H_3(z)=0.5+z^{-1}+0.5 \cdot Z^{-2}$. The selector signal is then generated by appending sequences of ±(1, 1, 1), where the polarity is selected randomly. This technique will result in second-order shaping of the mismatch-induced, normalized noise error signal e(n), and thus less oversampling will be needed. However, first-order mismatch-shaping D/A converter systems, which are oversampled 8 times or more and implemented using a modern CMOS technology with relatively good matching properties, will generally not be limited by mismatch-induced noise, but will generally be limited by thermal noise. Hence, first-order mismatch-shaping techniques are sufficiently effective for most practical purposes.

Third Preferred Embodiment

The power consumption of the D/A converter core [102] (FIG. 4) is proportional to the required signal-to-noise ratio, and to the number of KM periods in each D/A conversion cycle. The power consumption can, therefore, be reduced significantly if the second interpolation stage [208] in FIG. 10 comprises a noise-shaping interpolator (also called a delta-sigma interpolator) to reduce the resolution of $d_2$ (n) to, say, 8 bits. A noise-shaping interpolator will ideally not affect the signal-band spectral composition. The noise-shaping interpolator (not shown) need only be of first or second order.

Fourth Preferred Embodiment

The D/A converter's power consumption is largely independent of the oversampling ratio OSR of x(n). However, the master clock signal KM cannot be of arbitrarily high frequency. The maximum achievable signal bandwidth is thus inversely proportional to the oversampling ratio OSR of x(n). A simple way to increase the signal bandwidth is to reduce the resolution of $d_2$ (n) using a noise-shaping interpolator as discussed above. When this option has been exercised, reducing the oversampling ratio OSR of x(n) may be considered to further increase the signal bandwidth. However, if the oversampling ratio is very low, a more elaborate analog filter is needed to suppress mirror-image spectral components. Because only little hardware is required to implement the DAC core, it is justifiable to implement several as a part of an analog-domain interpolation process. FIG. 15 shows a D/A converter system [350] where d(n) is interpolated by a factor of eight in the digital domain, and since interpolated by a factor of two in the analog domain.

The three digital-domain interpolation stages [204][208] [212] are the same as shown in FIG. 10. The objective of this fourth preferred embodiment is to improve the rejection of the mirror-image spectral components comprised in x(n). The digital signal x(n) is D/A converted directly by a first DAC [352]; it is delayed by one half clock cycle and then D/A converted by a second DAC [354]; and finally it is delayed by one full clock cycle and then D/A converted by a third DAC [356]. The three DACs [352][354][356] are of the type [150] shown in FIG. 6, except that the driving circuit [112] and the output-stage opamps [118B][118A] are shared among the three of them. The DACs' [352][354] [356] respective gain factors, $G_1$, $G_2$, and $G_3$, are adjusted by sizing the DAC capacitors [104][106]. Mismatch of the gain factors will not cause distortion.

Because the system [350] is a multi-rate one, the transfer function from $d_2(n)$ to the analog output signal $V_{out}(t)$ is best described as a function of the frequency f, and not as transforms which are functions of z or s. FIG. 16 provides a set of equations representing the considered transfer function. The new element is the transfer function $H_{FIR}(f)$ representing the signal processing obtained by using multiple, time-interleaved DACs [352][354][356]. Notice that the FIR filter's Z-domain transfer function, $G_1+G_2 \cdot z^{-1}+G_3 \cdot z^{-2}$, is defined with respect to the high sampling frequency, $16 \cdot f_S$. The parameters η, $T_x$, $T_{KO}$, and $T_{RC}$ were defined in FIG. 12.

FIG. 17 shows the schematic of an implementation [400] of the DAC system [350]. The circuit comprises the third interpolation stage [212], the three DACs [352][354][356], and the shared output stage [358]. The clock phase generator [402] generates the control signals KM, KMa, KMb, KS, and KO according to the description above. The generator [402] also comprises the digital state machine [300] shown in FIG. 13 to generate the control signals KAh, KAl, KBh, and KBl according to the input signal $d_2$ (n) and the generated random signal RN. The signals controlling the three blocks of switched capacitors [404][406][408] implementing the DACs [352][354][356] are delayed $9 \cdot T_{KM}$ by each of the two 9-bit serial-in/serial-out registers [410][412]. The transition from the DAC system [200] shown in FIG. 10 to the DAC system [350] shown in FIG. 15 is associated with an only negligible increase of complexity. This fourth embodiment [400] is thus highly preferred.

FIG. 18 shows a timing diagram illustrating the time-interleaved responses from the three DACs [352][354][356]. The applied signal $d_2(n)$ is here a digital impulse signal. The three traces for $V_{out}(t)$ reflect three different sets of values of the FIR-filter coefficients: $G_1$, $G_2$, and $G_3$. For simplicity, it is assumed that $T_{RC}=0$ and that $2 \cdot C_{ref} = C_A + C_B = C_O$. The upper trace for $V_{out}(t)$ shows the output signal when $(G_1, G_2, G_3) = (1, 0, 0)$, i.e., when the DAC system [350] is equivalent to the DAC system [200] shown in FIG. 10. The next $V_{out}(t)$ trace shows the output signal when $(G_1, G_2, G_3) = (0.5, 0, 0.5)$, i.e., when the DAC system [350] operates effectively with only two time-interleaved DACs [352][356]. The lower trace shows the output signal when $(G_1, G_2, G_3) = (0.25, 0.5, 0.25)$, which is a preferred set of values. Notice that the step size of the response $V_{out}(t)$ to the applied digital impulse signal $d_2$ (n) is reduced when several time-interleaved DACs are used to reconstruct the signal. The reduced step size reflects an improved rejection of mirror-image spectral components, which is desirable. Clearly, any number of time-interleaved DACs may be used, and their impulse responses may be spaced by arbitrary delays. All DAC systems discussed above have a linear phase response.

Fifth Preferred Embodiment

The very simple way in which the selector signal t(n, k) is generated for mismatch-shaping operation is a significant advantage of the preferred embodiments described above. The simplicity comes at the cost that the last interpolation stage's [212] impulse response is restricted to only a few options. The suppression of the mirror-image spectral components is restricted accordingly. However, the remaining mirror-image spectral components can easily be suppressed almost arbitrarily well by means of the analog-domain interpolation technique described above. A fifth preferred embodiment does not restrict the last interpolation stage's [212] impulse response in the least, but uses a more elaborate digital state machine to generate the selector signal t(n, k).

The normalized error signal e(n) can be calculated using the equations provided in FIG. 9. Observe that e(n) is a function of the input signal x(n) and the selector signal t(n, k) only. Now referring to FIG. 19, an "error estimator" is defined as a digital state machine [452] that calculates e(n) on the basis of the input signal x(n) and the selector signal t(n, k). The input signal x(n) is a fixed parameter that cannot be changed. The selector signal is on the other hand a free parameter that may be used to control the error signal e(n). FIG. 20 shows a "switching selector" [456] receiving the input signal x(n) and a control signal w(n), and providing the selector signal t(n, k). The switching selector [456] generates the selector signal t(n, k) such that e(n) will attain a value close to the control signal's w(n) value. In other words, when the switching selector [456] is connected in series with the error estimator [452], the transfer characteristic from w(n) to e(n) will ideally be unity for any value of x(n). Unfortunately the range of values that e(n) can attain depends highly on the value of x(n). Given that x(n) is a fixed parameter, it is not generally possible to assure that e(n)=w(n). The polarity of e(n) is fully controllable, whereas the magnitude is controllable only to some extent. Inspired by single-bit noise-shaping (delta-sigma) interpolators, it is concluded that full controllability of the normalized error signal e(n) is not required. FIG. 21 shows a digital state machine [450] that will generate the selector signal t(n, k) such that e(n) is a noise-like signal with relatively less PSD in the signal band. As for traditional single-bit noise-shaping interpolators, the requirements for successful operation are:

1. that the negative-feedback system [450] is stable; and
2. that the linear loop filter [454] provides significant gain in the signal band.

FIG. 22 shows an implementation of the error estimator [452]. The basis signals b(n, k) defined in FIG. 9 are calculated by adding with a 16-bit adder [470] two signals: (1) x(n) masked bit-wise with a first masking signal $m_1(k)$, and (2) the two's complement of x(n) masked bit-wise with a second masking signal $m_2(k)$. FIGS. 23 and 24 show tables of the two masking signals: $m_1(k)$ and $m_2(k)$. When the selector signal is logically "low," i.e., when t(n, k)=−1, the two's complement of b(n, k) is calculated and accumulated by the accumulator [472]. When he selector signal is logically "high," b(n, k) is accumulated. The accumulator [472] is reset for each new sample of x(n) and is clocked by KM which represents the k variable.

FIG. 25 shows how the switching selector [456] is implemented. Recall that the value of e(n) is calculated as a plus-minus sum of the basis signals b(n, k), which depend exclusively on x(n), see FIG. 9. The polarity of b(n, k) is positive when x(n, k)=1, otherwise b(n, k) is negative or zero. The range of values that b(n, k) can attain is $\pm 2^{k-N-1}$. Hence, the value of e(n) is controlled mainly by a few most significant bits, say, t(n, 16) and t(n, 15). The switching selector [456] is simplified significantly by clustering the less significant basis signals: b(n, k), k=1, 2, 3, . . . ,14. A boolean signal s(n)=±1 is used to calculate the 14 LSBs of the control signal as t(n, k)=s(n)·x(n, k), where x(n, k) here exceptionally represents the numerical values ±1. The normalized error signal e(n) can thus be expressed as:

$$e(n) = t(n, 16) \cdot b(n, 16) + t(n, 15) \cdot b(n, 15) + s(n) \cdot \sum_{k=1}^{14} |b(n, k)|.$$

Some rough estimates of the expected values of b(n, k) are provided in FIG. 26. The estimates are based on the 2 MSBs of x(n) only; their accuracy is limited, but that is quite acceptable. By selecting t(n, 16), t(n, 15), and s(n), appropriately, the expected values of e(n) can be adjusted in steps of ⅛. FIG. 27 shows the expected values of e(n) that can be obtained, and the corresponding logic values of t(n, 16), t(n, 15), and s(n). The digital-logic circuit [480] in FIG. 25 merely implements the truth table shown in FIG. 27. The circuit [480] is implemented as shown in FIG. 28.

The complete selector-signal generator [450] is shown in FIG. 29. By not resetting the accumulator [472] in the error estimator [452], it implements a delaying integrator which is the first stage in the loop filter [454]. The loop filter's [454] transfer function is $(z^{-2} - 2 \cdot z^{-1})/(1 - z^{-1})^2$, whereby the so-called noise transfer function becomes the one classical for single-bit second-order noise-shaping interpolators: $(1-z^{-1})^2$. Because w(n) is truncated to four-bit resolution, the loop filter [454] need not operate with 16-bit resolution everywhere.

Conclusion, Ramification, and Scope of Invention

Accordingly, the reader will see that D/A converters implemented according to this invention have several significant advantages, including full compatibility with modern CMOS technologies, low cost, low circuit complexity, and low power consumption. Particularly it is an advantage that audio-quality linearity is achieved without relying on accurate matching of electrical properties; expensive trimming and calibration of the DAC circuit is thus not necessary, and the performance reliability is accordingly very good.

DAC circuits implemented according to this invention are, e.g., very suitable for use in portable, battery-powered audio applications. A signal bandwidth of 1 MHz and even more is achievable from these very simple DAC circuits. They may therefore also find wide-spread use in several other applications, e.g., modems, in need of a simple, low-cost, highly-linear, general-purpose D/A converter.

The DAC circuit is ideally symmetrical, and is characterized by a relaxed requirement for a stable, low-impedance reference voltage. The very linear operation is achieved by converting the error signal caused by mismatch of electrical parameters into a noise-like signal with very low power spectral density in the signal band. The mismatch-induced error signal is controlled to have this property by means of a selector signal not affecting the DAC's nominal operation. The digital state machine generating the selector signal is particularly simple to implement when the interpolation filter's last stage is a low-order FIR filter with predetermined coefficients. It is expected that this invention will be used primarily in conjunction with interpolations filters of this type. The symbiotic relationship of the interpolation filter, the DAC circuit, and the output stage is indeed a significant advantage of this invention. For example, the extreme simplicity of the DAC core allows for the use of a partly analog-domain interpolation technique, thereby relaxing the requirements to the digital interpolation filter and making the performance more robust to imperfections in the analog output stage. In comparison to the widely-used noise-shaping D/A converters, it is a remarkable advantage that the analog circuit contents has been reduced to essentially only one operational amplifier.

It is to be understood that while the above description contains many specificities, these should not be construed as limitations of the scope of invention, but rather as an exemplification of several preferred embodiments thereof. Many other variations are indeed possible. The signal x(n) converted by the DAC core can, e.g., be of any resolution. The signal bandwidth to power consumption ratio can be improved significantly by reducing the resolution of x(n) by means of a noise-shaping interpolator. Single-ended DAC circuits can be implemented, although fully-differential implementations are preferable. If a single-ended output signal $V_{out}(t)$ is required, the DAC core can be differential and the output stage made to perform the required differential to single-ended conversion. Clearly, the interpolation filter that typically precedes the DAC circuit can be of any type and order. Although not strictly necessary, the interpolation filter's last stage can preferable be an interpolating FIR filter of the same order as the last-stage interpolation factor. Mismatch shaping of arbitrarily high order can be achieved by increasing the order of the last-stage interpolation filter. However, first-order mismatch shaping operation is generally sufficient for most practical applications. The DAC can also be made mismatch-shaping with respect to a signal band other than the base band. The analog-domain interpolation techniques shown in FIG. 15 can be implemented with any number of time-interleaved DAC cores. The delay between the individual DAC cores may be uniform of non-uniform, and may be any fraction or multiple of the spacing of the samples in x(n). The analog-domain interpolation technique can be used with any type of DAC core which is of sufficiently low complexity. The technique can, e.g., also be used for single-bit noise-shaping current-mode DACs, and for unit-element mismatch-shaping DACs. The error estimator in FIG. 21 can truncate the basis signals b(n, k) to a lower resolution for reduced circuit complexity. The loop filter can be of any order; any loop filter suitable for use in noise-shaping interpolators is usable. The switching selector can be of almost any complexity; the simplest is to generate only one boolean signal s(n) controlling all values of t(n, k). The DAC circuit can be implemented in any technology providing good analog switches, including MOS, CMOS, BiCMOS, GaAs, SiGe, etc. It is also to be understood that this invention concerns the linearization of any type of D/A converter for which the mismatch-induced error signal can be written in the form $\delta \cdot e(n)$, where $\delta$ is an unknown mismatch parameter and e(n) is a function of only the input signal x(n) and a selector signal t(n). Those who are skilled in the art will be able to make many other variations and modifications without departing from the true nature and spirit of this invention. The validity and scope of invention of this patent should not be limited by errors that may have occurred in the process of preparing this document, including the Figures. Accordingly, the scope of invention should be determined exclusively by the appended claims and their legal equivalents.

I claim:

1. A method for converting a digital input signal to an analog output signal comprising the steps of:
   (a) providing a digital-to-analog converter producing said analog output signal and receiving a primary digital signal and a digital mismatch-control signal; said analog output signal nominally being independent of said digital mismatch-control signal;
   (b) producing said primary digital signal as a function of said digital input signal;
   (c) producing said mismatch-control signal.

2. The method of claim 1 wherein the step of producing said mismatch-control signal comprises the steps of:
   (a) defining a first-name interpolation rule for which the interpolation of any signal will result in a signal consisting of appended sections of each a first-integer number of samples; each of the appended sections of samples produced by said first-name interpolation rule being characterized by a second-name set of predetermined ratios of the individual samples within each section;
   (b) producing a third-name digital signal;
   (c) applying said first-name interpolation rule to said third-name digital signal.

3. The method of claim 2 wherein the step of producing said primary digital signal comprises the step of:
   (a) applying a fourth-name interpolation rule for which the interpolation of any signal will result in a signal consisting of appended sections of each a second-integer number of samples; each of the appended sections of samples produced by said fourth-name interpolation rule being characterized by a fifth-name set of predetermined ratios of the individual samples within each section.

4. The method of claim 3 wherein said second-integer number equals an integer multiplied by said first-integer number.

5. The method of claim 2 wherein the step of producing said third-name digital signal comprises the step of:
   (a) producing a digital signal which is essentially aperiodic.

6. The method of claim 2 wherein the step of producing said third-name digital signal comprises the step of:
   (a) producing a digital signal which is at least pseudo random.

7. The method of claim 1 wherein the step of providing a digital-to-analog converter comprises the step of:
   (a) providing a serial digital-to-analog converter.

8. The method of claim 7 wherein the step of providing a serial digital-to-analog converter comprises the steps of:
   (a) providing a pair of matched capacitors;
   (b) choosing for each cycle of the serial conversion process which capacitor in said pair of matched capacitors be the driving capacitor;
   (c) charging in each cycle of the serial conversion process the driving capacitor according to a segment of the code representing the digital input signal.

9. The method of claim 8 wherein the step of choosing which capacitor be the driving capacitor comprises the step of:
   (a) making an essently aperiodic choice.

10. The method of claim 8 wherein the step of choosing which capacitor be the driving capacitor comprises the step of:
    (a) evaluating said primary digital signal.

11. The method of claim 8 wherein the step of choosing which capacitor be the driving capacitor comprises the step of:
    (a) calculating a normalized estimate of the error signal induced by mismatch of the matched pair of capacitors.

12. The method of claim 8 wherein the step of choosing which capacitor be the driving capacitor comprises the steps of:
    (a) defining a first-integer number greater than zero;
    (b) in at least one third of the conversion cycles, making a choice that will deterministically affect the choice to be made said first-integer number of conversion cycles later.

13. The method of claim 8 wherein the step of charging the driving capacitor comprises the step of:
    (a) charging the driving capacitor to a fixed voltage independent of the primary digital signal.

14. The method of claim 1 wherein the step of producing said primary digital signal comprises the step of:
    (a) applying a first-name interpolation rule for which the interpolation of any signal will result in a signal consisting of appended sections of each a first-integer number of samples; each of the appended sections of samples produced by said first-name interpolation rule being characterized by a second-name set of predetermined ratios of the individual samples within each section.

15. A method for converting a multi-bit digital input signal to an analog output signal comprising the steps of:
    (a) providing a first-name continuous-time analog signal by digital-to-analog converting said digital input signal;
    (b) providing a second-name continuous-time analog signal by digital-to-analog converting said digital input signal; said second-name continuous-time analog signal being delayed by a first-duration period of time relative to said first-name continuous-time analog signal;
    (c) adding said first-name continuous-time analog signal and said second-name continuous-time analog signal.

16. The method of claim 15 further comprising the step of:
    (a) providing a serial digital-to-analog converter.

17. The method of claim 16 further comprising the step of:
    (a) providing a matched pair of capacitors.

18. The method of claim 17 wherein the capacitors of said matched pair of capacitors are logically interchanged as a function of an essentially aperiodic selector signal.

19. The method of claim 16 wherein said serial digital-to-analog converter is mismatch-shaping.

20. The method of claim 15 wherein each sample of said digital input signal is repeated twice.

21. The method of claim 20 further comprising the steps of:
    (a) providing a symmetrical digital-to-analog converter with a first configuration and a second configuration nominally equivalent to said first configuration;
    (b) toggling between said symmetrical digital-to-analog converter's first and second configurations according to a boolean selector signal; said selector signal being logically inverted for the conversion of the two samples within each set of neighboring, identical samples.

22. The method of claim 15 where the product of said first-duration period of time and the sampling frequency of said digital input signal is non-integer.

23. The method of claim 15 further comprising the step of:
    (a) providing a mismatch-shaping digital-to-analog converter.

24. The method of claim 15 further comprising the step of:
    (a) providing exactly one operational amplifier.

25. A method for converting a digital input signal to an analog output signal comprising the steps of:
    (a) providing a binary-weighted serial representation of said digital input signal;
    (b) generating a selector signal being logically high for a first set of bits selected from said serial representation, and being logically low for the bits in said serial representation that are not selected as elements in said first set of bits;
    (c) providing a first reference analog signal value;
    (d) providing a second reference analog signal value;
    (e) providing a first and a second storage element, each being capable of storing an analog signal value;
    (f) providing means to controllably connect said first and second storage elements, such that upon activation of said means to connect them, the storage elements will each be set to store an analog signal value representing the average value of the two analog signal values stored by the storage elements immediately prior to the activation of said means;
    (g) processing sequentially the bits in said serial representation of the digital input signal, by for each bit performing the following steps:
        i. if the bit being processed is logically high and the selector signal for that bit is logically high, storing the first reference analog signal value in the first storage element;
        ii. if the bit being processed is logically high and the selector signal for that bit is logically low, storing the first reference analog signal value in the second storage element;
        iii. if the bit being processed is logically low and the selector signal for that bit is logically high, storing the second reference analog signal value in the first storage element;

iv. if the bit being processed is logically low and the selector signal for that bit is logically low, storing the second reference analog signal value in the second storage element;

v. activating said means to controllably connect said first and second storage elements.

26. The digital-to-analog conversion method of claim 25 wherein said serial representation consists of appended sections of a first-integer length; each section comprising a sequence of bits which is repeated according to a first predefined rule common for all the appended sections.

27. The digital-to-analog conversion method of claim 26 wherein said selector signal consists of appended sections of said first-integer length; each section comprising a sequence of bits which is repeated according to a second predefined rule common for all the appended sections.

28. The digital-to-analog conversion method of claim 25 wherein said selector signal is essentially aperiodic.

29. The digital-to-analog conversion method of claim 25 wherein the step of generating said selector signal comprises the step of:

(a) calculating a normalized estimate of an error signal that will result from mismatch of electrical parameters.

30. A digital-to-analog converter receiving a digital input signal and providing an analog output signal comprising:

(a) an output stage comprising an operational amplifier;

(b) a first capacitor;

(c) a second capacitor, nominally identical to said first capacitor;

(d) a means to periodically connect in parallel and isolate said first capacitor and said second capacitor;

(e) a digital state machine providing a serial representation of said digital input signal and an aperiodic selector signal attaining a boolean value for each bit in said serial representation;

(f) a first-name means to charge said first capacitor according to a bit in said serial representation when said selector signal attains a first logical value;

(g) a second-name means to charge said second capacitor according to a bit in said serial representation when said selector signal attains a second logical value;

(h) a means to periodically connect said first capacitor to said output stage.

31. The digital-to-analog converter of claim 30 further comprising:

(a) means to calculate a normalized estimate of the error that will result from mismatch of said first capacitor and said second capacitor.

32. The digital-to-analog converter of claim 30 wherein said digital state machine comprises:

(a) means to generate a signal which is at least pseudo random.

* * * * *